US012604559B2

(12) United States Patent
Tang et al.

(10) Patent No.: US 12,604,559 B2
(45) Date of Patent: Apr. 14, 2026

(54) PASSIVATED CONTACT STRUCTURE, SOLAR CELL, MODULE AND SYSTEM

(71) Applicants: ZHEJIANG AIKO SOLAR TECHNOLOGY CO., LTD., Jinhua (CN); ZHUHAI FUSHAN AIKO SOLAR TECHNOLOGY CO., LTD., Zhuhai (CN); TIANJIN AIKO SOLAR TECHNOLOGY CO., LTD., Tianjin (CN); GUANGDONG AIKO SOLAR TECHNOLOGY CO., LTD., FoShan (CN)

(72) Inventors: Yuanzhao Tang, Jinhua (CN); Kaifu Qiu, Jinhua (CN); Yongqian Wang, Jinhua (CN); Wenjie Lin, Jinhua (CN); Xinqiang Yang, Jinhua (CN); Gang Chen, Jinhua (CN)

(73) Assignees: ZHEJIANG AIKO SOLAR TECHNOLOGY CO., LTD., Jinhua (CN); ZHUHAI FUSHAN AIKO SOLAR TECHNOLOGY CO., LTD., Zhuhai (CN); TIANJIN AIKO SOLAR TECHNOLOGY CO., LTD., Tianjin (CN); GUANGDONG AIKO SOLAR TECHNOLOGY CO., LTD., FoShan (CN)

( * ) Notice: Subject to any disclaimer, the term of this patent is extended or adjusted under 35 U.S.C. 154(b) by 0 days.

(21) Appl. No.: 19/242,841

(22) Filed: Jun. 18, 2025

(65) Prior Publication Data

US 2025/0318316 A1    Oct. 9, 2025

Related U.S. Application Data

(63) Continuation of application No. PCT/CN2023/121031, filed on Sep. 25, 2023.

(30) Foreign Application Priority Data

Dec. 19, 2022    (CN) .......................... 202211629997.8

(51) Int. Cl.
*H10F 77/20*        (2025.01)
*H10F 77/1223*      (2025.01)
(Continued)

(52) U.S. Cl.
CPC ....... *H10F 77/211* (2025.01); *H10F 77/1223* (2025.01); *H10F 77/1642* (2025.01); *H10F 77/311* (2025.01)

(58) Field of Classification Search
CPC .............. H10F 77/211; H10F 77/1223; H10F 77/1642; H10F 77/311
See application file for complete search history.

(56) References Cited

U.S. PATENT DOCUMENTS

2023/0361227 A1*  11/2023  Zhang ..................... H10F 10/14

FOREIGN PATENT DOCUMENTS

CN      110112226 A    8/2019
CN      111416013 A    7/2020
(Continued)

OTHER PUBLICATIONS

The World Intellectual Property Organization (WIPO) International Search Report for PCT/CN2023/121031 Jul. 4, 2024 5 Pages (including translation).

*Primary Examiner* — Tae-Sik Kang
(74) *Attorney, Agent, or Firm* — ANOVA LAW GROUP, PLLC

(57) ABSTRACT

The present disclosure is applicable to the technical field of solar cells, and provides a passivated contact structure, a solar cell, a module, and a system. The passivated contact structure of a solar cell includes: a silicon substrate; and a
(Continued)

first silicon oxide layer, a doped layer, a second silicon dioxide layer and a passivation layer, which are sequentially disposed on the silicon substrate, wherein a local region of the first silicon oxide layer includes a thinned region, and the proportion of a silicon oxide content in the first silicon oxide layer is reduced in the thinned region. Thus, the thinning of the local region of the first silicon oxide layer allows H to quickly pass through, so that a H passivation effect can be effectively improved, and the heat treatment control difficulty is reduced.

11 Claims, 2 Drawing Sheets

(51) Int. Cl.
H10F 77/164 (2025.01)
H10F 77/30 (2025.01)

(56) References Cited

FOREIGN PATENT DOCUMENTS

| | | | |
|---|---|---|---|
| CN | 113284961 A | 8/2021 | |
| CN | 219350240 U | 7/2023 | |
| WO | WO-2022156101 A1 * | 7/2022 | ............. H10F 71/00 |

* cited by examiner

PASSIVATED CONTACT STRUCTURE, SOLAR CELL, MODULE AND SYSTEM

CROSS-REFERENCES TO RELATED APPLICATIONS

The present application is a continuation application of International Application No.: PCT/CN2023/121031, filed on Sep. 25, 2023, which claims the priority to Chinese patent application CN202211629997.8, filed on Dec. 19, 2022, all of which are incorporated in their entireties herein by reference.

TECHNICAL FIELD

The present disclosure belongs to the technical field of solar cells, and particularly relates to a passivated contact structure, a solar cell, a module, and a system.

BACKGROUND

Solar cell power generation is a sustainable and clean energy source that utilizes the photovoltaic effect of a semiconductor p-n junction to convert sunlight into electrical energy, and the resulting current is led out from an electrode via a conductive region.

In the related art, the conductive region of a solar cell includes a passivated contact structure. The passivated contact structure isolates a doped layer from a silicon substrate by using a tunneling layer, so as to form a structure in which the silicon substrate, the tunneling layer and the doped layer are stacked in sequence. However, in the existing passivated contact structure, due to the thickness of a silicon oxide layer, H cannot pass quickly, resulting in a worse H passivation effect, and a relatively large difficulty test is also provided for a heat treatment control process.

On this basis, how to design the passivated contact structure to improve the H passivation effect and to reduce the heat treatment control difficulty becomes an urgent problem to be solved.

SUMMARY

Technical Solution

The present disclosure provides a passivated contact structure, so as to solve the problem of how to design the passivated contact structure to improve a H passivation effect and to reduce heat treatment control difficulty.

The present disclosure provides a passivated contact structure of a solar cell, including:

a silicon substrate; and a first silicon oxide layer, a doped layer, a second silicon dioxide layer and a passivation layer, which are sequentially disposed on the silicon substrate, wherein a local region of the first silicon oxide layer includes a thinned region, and a proportion of a silicon oxide content in the first silicon oxide layer is reduced in the thinned region.

Further, a doping element of the doped layer and a doping element of the first silicon oxide layer are either a third main group element or a fifth main group element.

Further, the third main group element is a boron.

Further, the fifth main group element is a phosphorus.

Further, the thickness of the first silicon oxide layer and the thickness of the second silicon dioxide layer are both less than or equal to 3 nm.

Further, the thickness of the first silicon oxide layer is less than or equal to 2.5 nm, and the thickness of the second silicon dioxide layer is less than or equal to 2 nm.

Further, the doped layer is a doped polysilicon layer.

Further, the passivation layer is one or a combination of more of an oxide layer, a silicon carbide layer and an amorphous silicon layer.

The present disclosure further provides a solar cell, wherein the solar cell is a topcon cell or a back-contact cell, and the topcon cell or the back-contact cell includes the passivated contact structure of the solar cell as described above.

The present disclosure further provides a solar cell module, including the solar cell as described above.

The present disclosure further provides a solar cell system, including the solar cell module as described above.

According to the passivated contact structure in the embodiments of the present disclosure, the local region of the first silicon oxide layer includes the thinned region, the proportion of the silicon oxide content in the first silicon oxide layer is reduced in the thinned region, a region other than the thinned region is a non-thinned region, the silicon oxide content of the thinned region is lower than the silicon oxide content of the non-thinned region, and the thinning of the local region of the first silicon oxide layer allows H to quickly pass through, so that a H passivation effect can be effectively improved, and the heat treatment control difficulty is reduced.

Figure 1:
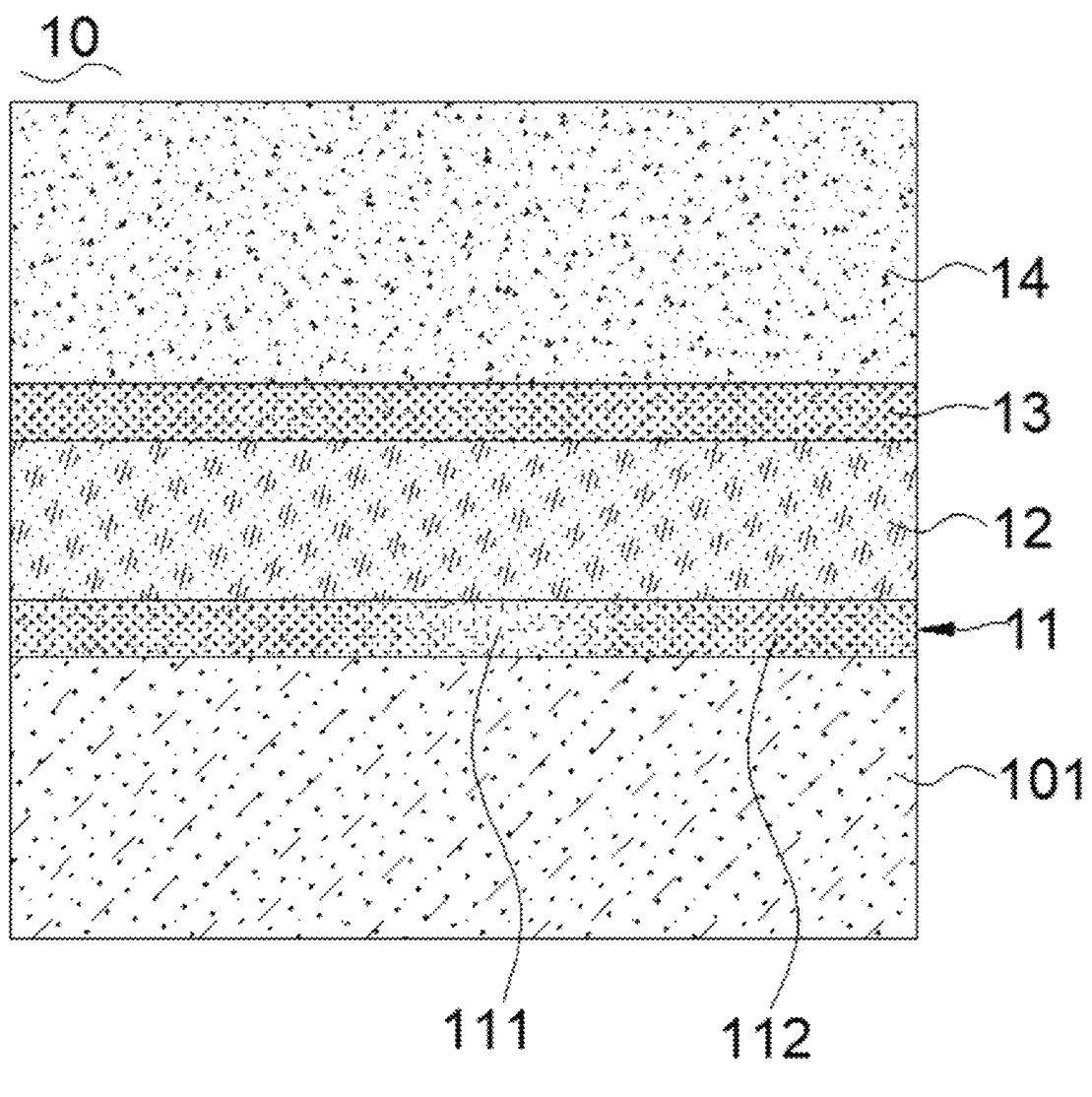
FIG. 1 is a schematic structural diagram of a passivated contact structure of a solar cell provided in an embodiment of the present disclosure.

DESCRIPTION OF MAIN ELEMENT SYMBOLS solar cell 100, passivated contact structure 10, silicon substrate 101, first silicon oxide layer 11, thinned region 111, non-thinned region 112, doped layer 12, second silicon dioxide layer 13, and passivation layer 14.

DETAILED DESCRIPTION OF THE EMBODIMENTS

To make the objectives, technical solutions and advantages of the present disclosure clearer, the present disclosure will be further described below in detail in combination with the drawings and embodiments. It should be understood that specific embodiments described herein are only used to explain the present disclosure and are not intended to limit the present disclosure.

In the present disclosure, a local region of a first silicon oxide layer includes a thinned region, the proportion of a silicon oxide content in the first silicon oxide layer is reduced in the thinned region, a region other than the thinned region is a non-thinned region, the silicon oxide content of the thinned region is lower than the silicon oxide content of the non-thinned region, and the thinning of the local region of the first silicon oxide layer allows H to quickly pass through, so that a H passivation effect can be effectively improved, and the heat treatment control difficulty is reduced.

Embodiment 1

Referring to FIG. 1, a passivated contact structure 10 of a solar cell according to an embodiment of the present disclosure includes:

a silicon substrate 101; and a first silicon oxide layer 11, a doped layer 12, a second silicon dioxide layer 13 and a passivation layer 14, which are sequentially disposed on the silicon substrate 101, wherein a local region of the first silicon oxide layer 11 includes a thinned region 111, and the thinned region 111 only includes trace silicon oxide.

A region of the first silicon oxide layer 11 other than the thinned region 111 can be defined as a non-thinned region 112. In the thinned region 111, the content of a silicon oxide is obviously reduced, so that the silicon oxide becomes discrete and loose, and thus the substance of the doped layer 12 can directly permeate into the silicon substrate 101 through the thinned region 111.

The silicon oxide content of the thinned region 111 is significantly lower than the silicon oxide content of the non-thinned region 112. Under an optical microscope, it can be seen that the first silicon oxide layer 11 is expressed as a bright band with a width of about 1 nm, the gloss thereof is different from the gloss of materials on both sides and is brighter, it can be seen in the local region that the brightness of the bright band becomes dark, and a boundary with the materials on the two sides is relatively not obvious, and thus the region corresponds to the thinned region 111.

According to the passivated contact structure 10 of the solar cell in the embodiment of the present disclosure, the local region of the first silicon oxide layer 11 includes the thinned region 111, the proportion of the silicon oxide content in the first silicon oxide layer 11 is reduced in the thinned region 111, the region other than the thinned region 111 is the non-thinned region 112, the silicon oxide content of the thinned region 111 is lower than the silicon oxide content of the non-thinned region 112, and the thinning of the local region of the first silicon oxide layer 11 allows H to quickly pass through, so that a H passivation effect can be effectively improved, and the heat treatment control difficulty is reduced.

Specifically, there are a plurality of thinned regions 111. Further, the plurality of thinned regions 111 are randomly and discretely distributed. Further, in some embodiments, the areas of the plurality of thinned regions 111 are the same, in some embodiments, the areas of the plurality of thinned regions 111 are different; and in some embodiments, the silicon oxide contents of the plurality of thinned regions 111 are the same, in some embodiments, the silicon oxide contents of the plurality of thinned regions 111 are different.

Specifically, there are a plurality of non-thinned regions 112. Further, the plurality of thinned regions 111 are randomly and discretely distributed. Further, in some embodiments, the areas of the plurality of non-thinned regions 112 are the same, in some embodiments, the areas of the plurality of non-thinned regions 112 are different; and in some embodiments, the silicon oxide contents of the plurality of non-thinned regions 112 are the same, in some embodiments, the silicon oxide contents of the plurality of non-thinned regions 112 are different.

Figure 2:
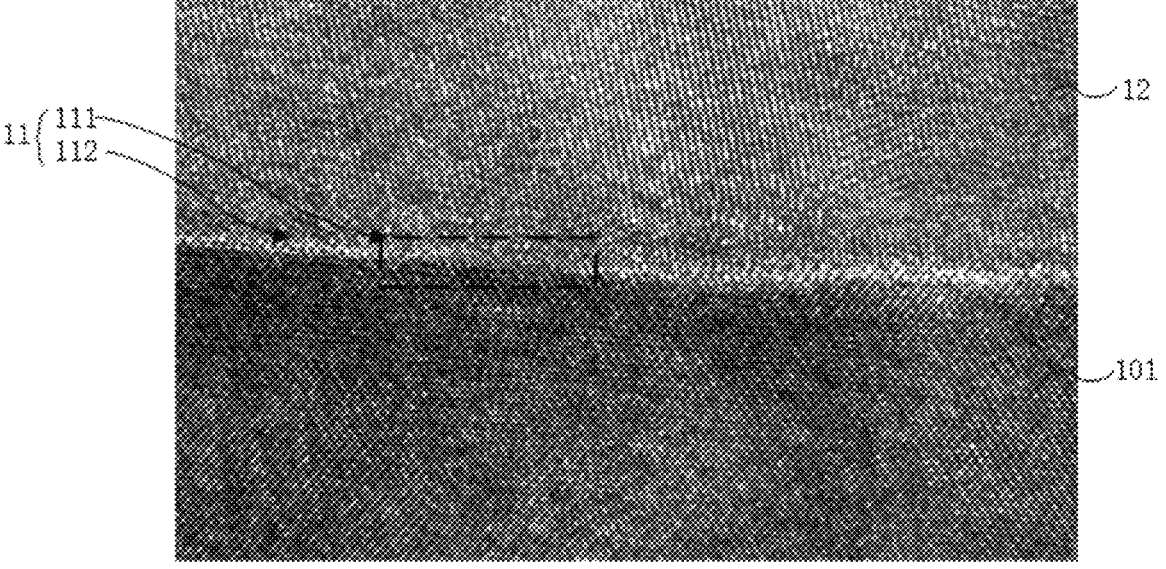
FIG. 2 is an actual detection image of a cross section of a passivated contact structure of a solar cell provided in an embodiment of the present disclosure under an optical microscope.

FIG. 2 is an actual detection image of a cross section of the passivated contact structure 10 of the solar cell under the optical microscope. In FIG. 2, the first silicon oxide layer 11 is a strip-shaped structure, which extends from a left end to a right end of FIG. 2. The gloss of the first silicon oxide layer 11 is different from the gloss of the doped layer 12 and the gloss of the silicon substrate 101, and the gloss of the first silicon oxide layer 11 is brighter than the gloss of the doped layer 12 and the gloss of the silicon substrate 101. Moreover, there is a difference in bright and dark regions in an extension direction of the first silicon oxide layer 11, that is, the silicon oxide of the first silicon oxide layer 11 is not uniformly distributed.

Specifically, in a region with a higher silicon oxide content in the first silicon oxide layer 11, the first silicon oxide layer 11 has a greater thickness and brighter gloss, that is, the region is a non-thinned region 112; in a region with a lower silicon oxide content in the first silicon oxide layer 11, the silicon oxide content is ultra-thin, and the gloss is darker, that is, the region is a thinned region 111.

Further, in the extension direction of the first silicon oxide layer 11, the thinned regions 111 and the non-thinned regions 112 are distributed in a staggered manner, therefore it can be seen in FIG. 2 that the first silicon oxide layer 11 forms a bright and dark alternating gloss change in the extension direction.

It can be understood that since the silicon oxide content of the thinned region 111 is very low, obvious boundaries of the first silicon oxide layer 11 with the silicon substrate 101 and the doped layer 12 cannot be seen under the optical microscope, resulting in an almost direct contact between the doped layer 12 and the corresponding silicon substrate 101. In this way, a doping element of the doped layer 12 can permeate through the thinned region 111 of the first silicon oxide layer 11 to the silicon substrate 101.

Specifically, the silicon substrate 101 includes a front surface and a back surface, which face away from each other, the front surface faces the sun during normal operation and thus is a light facing surface, which can directly receive the sunlight. The back surface faces away from the sun during normal operation, and the back surface can receive the sunlight reflected by the ground in a case where the solar cell is obliquely disposed on the ground.

In the present embodiment, the silicon substrate 101 is an N-type monocrystalline silicon wafer. It can be understood that in other embodiments, the silicon substrate 101 can also be other types of silicon wafers, such as a multicrystalline silicon wafer and a quasi-monocrystalline silicon wafer. In some embodiments, the silicon substrate 101 is a P type, and the silicon substrate 101 can be set according to actual use requirements, which is not specifically limited herein.

Specifically, an inner diffusion layer can be formed between the silicon substrate 101 and the first silicon oxide layer 11. The inner diffusion layer includes one or more a doped crystalline silicon layer, a doped amorphous silicon layer, a doped polysilicon layer, a doped nanocrystalline silicon layer, a doped mixed-phase silicon layer, a doped silicon carbide layer, a doped silicon dioxide layer, a doped silicon oxycarbide layer, a doped silicon oxynitride layer, and a doped silicon carbonitride oxide layer. It can be understood that in other embodiments, the silicon substrate 101 and the first silicon oxide layer 11 can be in direct contact without forming the inner diffusion layer.

Specifically, there can be one first silicon oxide layer 11. It can be understood that in other embodiments, there can be 2, 3, 4 or other numbers of first silicon oxide layers 11.

Specifically, in some embodiments, the first silicon oxide layer 11 is disposed on the entire surface of the silicon substrate 101, and in some embodiments, the first silicon oxide layer 11 is locally disposed on the silicon substrate 101.

Specifically, the doped layer 12 includes one or more of a doped amorphous silicon layer, a doped polysilicon layer, a doped nanocrystalline silicon layer, a doped mixed-phase silicon layer, a doped silicon carbide layer, a doped silicon dioxide layer, a doped silicon oxycarbide layer, a doped silicon oxynitride layer, and doped silicon carbonitride oxide layer.

Further, in a case where the doped layer 12 includes a plurality of the above film layers, the plurality of film layers can be mixed with each other, and can also be stacked in sequence; or, some types of the film layers can be mixed, and the remaining types of the film layers are stacked in sequence; or, a plurality of film layers in some regions are mixed, and a plurality of film layers in the remaining regions are stacked in sequence. A specific form of the doped layer 12 is not limited herein.

Further, the doped layer 12 includes a plurality of layers of doped films stacked in sequence, and the refractive indexes of two adjacent layers of doped films are different. In this way, the two adjacent layers of doped films can form a refractive index gradient, thereby achieving gradient extinction, so that the absorption of light by the solar cell can be enhanced, and an improvement in the photoelectric conversion efficiency is facilitated. It can be understood that in other embodiments, the doped layer 12 includes a plurality of layers of doped films stacked in sequence, and the refractive indexes of the two adjacent layers of doped films can be the same.

Specifically, in some embodiments, the doping polarity of the doped layer 12 is the same as that of the silicon substrate 101, in some embodiments, the doping polarity of the doped layer 12 is different from that of the silicon substrate 101. In other words, the doping polarity of the doped layer 12 and the doping polarity of the silicon substrate 101 can both be an N type or a P type; or, the doping polarity of the doped layer 12 is the N type, and the doping polarity of the silicon substrate 101 is the P type; or, the doping polarity of the doped layer 12 is the P type, and the doping polarity of the silicon substrate 101 is the N type.

Specifically, the doped layer 12 can be disposed on the entire surface of the first silicon oxide layer 11. It can be understood that in other embodiments, the doped layer 12 can also be locally disposed on the first silicon oxide layer 11.

Specifically, in some embodiments, the structure of the second silicon dioxide layer 13 is the same as that of the first silicon oxide layer 11. In some embodiments, the second silicon dioxide layer 13 is denser and thicker than the first silicon oxide layer 11.

Specifically, the thickness of the second silicon dioxide layer 13 is greater than 0.3 nm and less than 0.5 nm, for example, 0.31 nm, 0.32 nm, 0.38 nm, 0.4 nm, 0.45 nm and 0.49 nm. It can be understood that the second silicon dioxide layer 13 can form a dense semi-coherent grain boundary with the doped layer 12, an external metal can easily form a short circuit via the semi-coherent grain boundary to diffuse to the silicon substrate 101, resulting in a decrease in electrical performance or PID failure, and the second silicon dioxide layer 13 with a thickness greater than 0.3 nm can effectively block the diffusion of metal impurities. Meanwhile, the second silicon dioxide layer 13 with a thickness less than 5 nm allows H ions in the passivation layer 14 on an outer layer to quickly pass through the doped layer 12, an interface between the doped layer 12 and the silicon substrate 101 and the silicon substrate 101 during heat treatments such as sintering and annealing, thereby forming effective H passivation.

Specifically, there is one second silicon dioxide layer 13. It can be understood that in other embodiments, there can be 2, 3, 4 or other numbers of second silicon dioxide layers 13.

Specifically, the second silicon dioxide layer 13 can be disposed on the entire surface of the doped layer 12. It can be understood that in other embodiments, the second silicon dioxide layer 13 can also be locally disposed on the doped layer 12.

Specifically, the passivation layer 14 includes at least one of a silicon oxide layer, a silicon nitride layer and a silicon oxynitride layer. In this way, surface passivation of the solar cell is realized.

Further, there can be 1, 2, 3 or other numbers of passivation layers 14.

Further, the passivation layer 14 can be formed with an open slot. In this way, an electrode passes through the passivation layer 14 and the second silicon dioxide layer 13 via the open slot to make contact with the doped layer 12, so as to lead out current generated by the solar cell.

Embodiment 2

In some optional embodiments, a doping element of the doped layer 12 and a doping element of the first silicon oxide layer 11 are either a third main group element or a fifth main group element.

In this way, by using the third main group element or the fifth main group element, the doped layer 12 and the first silicon oxide layer 11 form a P-type doped region or an N-type doped region, so as to form a PN junction on the silicon substrate 101.

Specifically, the third main group element includes boron, aluminum, gallium, indium, and thallium. The doping element of the doped layer 12 and the doping element of the first silicon oxide layer 11 can be one or more of boron, aluminum, gallium, indium, and thallium.

Specifically, the fifth main group element includes nitrogen, phosphorus, arsenic, antimony, and bismuth. The doping element of the doped layer 12 and the doping element of the first silicon oxide layer 11 can be one or more of nitrogen, phosphorus, arsenic, antimony, and bismuth.

Embodiment 3

In some optional embodiments, the third principal group element is a boron. By means of the boron, the doped layer 12 and the first silicon oxide layer 11 form a P-type doped region. Of course, in other embodiments, the third main group element can also be other elements, and details are not described herein again.

Embodiment 4

In some optional embodiments, the fifth main group element is a phosphorus. By means of the phosphorus, the doped layer 12 and the first silicon oxide layer 11 form an N-type doped region. Of course, in other embodiments, the fifth main group element can also be other elements, and details are not described herein again.

Embodiment 5

In some optional embodiments, the thickness of the first silicon oxide layer 11 and the thickness of the second silicon dioxide layer 13 are both less than or equal to 3 nm. That is, the thickness of the first silicon oxide layer 11 is less than or equal to 3 nm, and the thickness of the second silicon dioxide layer 13 is also less than or equal to 3 nm.

In this way, the thickness of the first silicon oxide layer 11 and the thickness of the second silicon dioxide layer 13 are respectively in a proper range, so that the first silicon oxide layer 11 has better impurity absorption and conductive effects, and the second silicon dioxide layer 13 has better effects of blocking the diffusion of metal impurities and enabling the H ions to quickly pass through.

Specifically, the thickness of the first silicon oxide layer 11 is, for example, 2.9 nm, 2.8 nm, 2.5 nm, 2.2 nm, 2 nm, 1.5 nm, 1 nm, 0.8 nm, and 0.5 nm.

Specifically, the thickness of the second silicon dioxide layer 13 is, for example, 0.5 nm, 0.8 nm, 1 nm, 1.2 nm, 1.5 nm, 2 nm, 2.5 nm, 2.8 nm, and 3 nm.

Embodiment 6

In some optional embodiments, the thickness of the first silicon oxide layer 11 is less than or equal to 2.5 nm, and the thickness of the second silicon dioxide layer 13 is less than or equal to 2 nm.

In this way, the thickness of the first silicon oxide layer 11 and the thickness of the second silicon dioxide layer 13 are respectively in a more proper range, so that the first silicon oxide layer 11 has better impurity absorption and conductive effects, and the second silicon dioxide layer 13 has better effects of blocking the diffusion of metal impurities and enabling the H ions to quickly pass through.

Specifically, the thickness of the first silicon oxide layer 11 is, for example, 0.5 nm, 0.8 nm, 1 nm, 1.2 nm, 1.5 nm, 1.8 nm, 2 nm, 2.3 nm, and 2.5 nm.

Specifically, the thickness of the second silicon dioxide layer 13 is, for example, 0.5 nm, 1 nm, 1.2 nm, 1.5 nm, 1.8 nm, 1.9 nm, and 2 nm.

Specifically, in the first silicon oxide layer 11, more than 80% of silicon oxide is concentrated in a thickness region of 0.5 nm to 2.5 nm. The silicon oxide contents in some regions are higher, and the silicon oxide content is expressed as a higher thickness greater than 2.5 nm in the first silicon oxide layer 11. That is, the thickness of the first silicon oxide layer 11 of the thinned region 111 is 0.5 nm to 2.5 nm, and the thickness of the first silicon oxide layer 11 of the non-thinned region 112 is greater than 2.5 mm.

Embodiment 7

In some optional embodiments, the doped layer 12 is a doped polysilicon layer.

In this way, compared with the first silicon oxide layer 11, it is easier to dope an intrinsic polysilicon layer into a doped polysilicon layer, so that the doping of the intrinsic polysilicon layer can be prevented from affecting the first silicon oxide layer 11, and the normal preparation and functions of the first silicon oxide layer 11 and the doped polysilicon layer are ensured. Moreover, the doped polysilicon layer can block the diffusion of the metal impurities, and allow the H ions in the passivation layer 14 to quickly pass through during heat treatments such as sintering and annealing to reach the silicon substrate 101, thereby forming effective H passivation.

In the embodiment of FIG. 2, the brightness of the doped layer 12 is between the brightness of the first silicon oxide layer 11 and the brightness of the silicon substrate 101. Specifically, the doped layer 12 is darker than the first silicon oxide layer 11 and is brighter than the silicon substrate 101. The doped layer 12 is formed with blocks with different brightness, and the doping concentrations of the blocks with different brightness are different. The difference between the brightness of the doped layer 12 and the brightness of the thinned region 111 of the first silicon oxide layer 11 is relatively large, and thus an obvious boundary line is formed. The difference between the brightness of the doped layer 12 and the brightness of the non-thinned region 112 of the first silicon oxide layer 11 is relatively small, but the boundary line can still be seen indistinctly.

Embodiment 8

In some optional embodiments, the passivation layer 14 is one or a combination of more of an oxide layer, a silicon carbide layer, and an amorphous silicon layer.

In this way, a good passivation effect is achieved.

For example, the passivation layer 14 is an oxide layer made of a single material; as another embodiment, the passivation layer 14 is a combination of an oxide layer and an amorphous silicon layer, which are made of a plurality of materials; and as another embodiment, the passivation layer 14 is a combination of multiple layers of amorphous silicon with different refractive indexes and made of a single material. In addition, the passivation layer 14 can also be a silicon oxynitride layer, a silicon nitride layer, or the like. It can be understood that a specific structural arrangement of the passivation layer 14 includes, but is not limited to, the foregoing listed manners, and the passivation layer 14 can be correspondingly set according to actual use requirements, which is not specifically limited herein.

Further, the thickness of the passivation layer 14 is 0.5 nm to 10 nm. Preferably, the thickness of the passivation layer 14 is preferably 0.8 nm to 2 nm. It can be understood that the thickness of the passivation layer 14 can be set as the thickness of a tunneling layer in the prior art, and can also be set to be greater than the thickness of the existing tunneling layer, which is set according to actual use requirements and is not specifically limited herein.

Preferably, the passivation layer 14 is an oxide layer and a silicon carbide layer, which are sequentially disposed outwards from the second silicon dioxide layer 13. Further, the oxide layer is preferably one or more of a silicon oxide layer and an aluminum oxide layer. Further, the silicon carbide layer includes a hydrogenated silicon carbide layer, at this time, hydrogen in the hydrogenated silicon carbide layer enters the silicon substrate 101 under the action of a diffusion mechanism and a thermal effect, and can neutralize a dangling bond on the back surface of the silicon substrate 101 to passivate defects of the silicon substrate 101, so as to transfer an energy bands in a forbidden band to a valence band or a conduction band, thereby improving the probability of carriers entering the second silicon dioxide layer 13 from the passivation layer 14.

Embodiment 9

Figure 3:
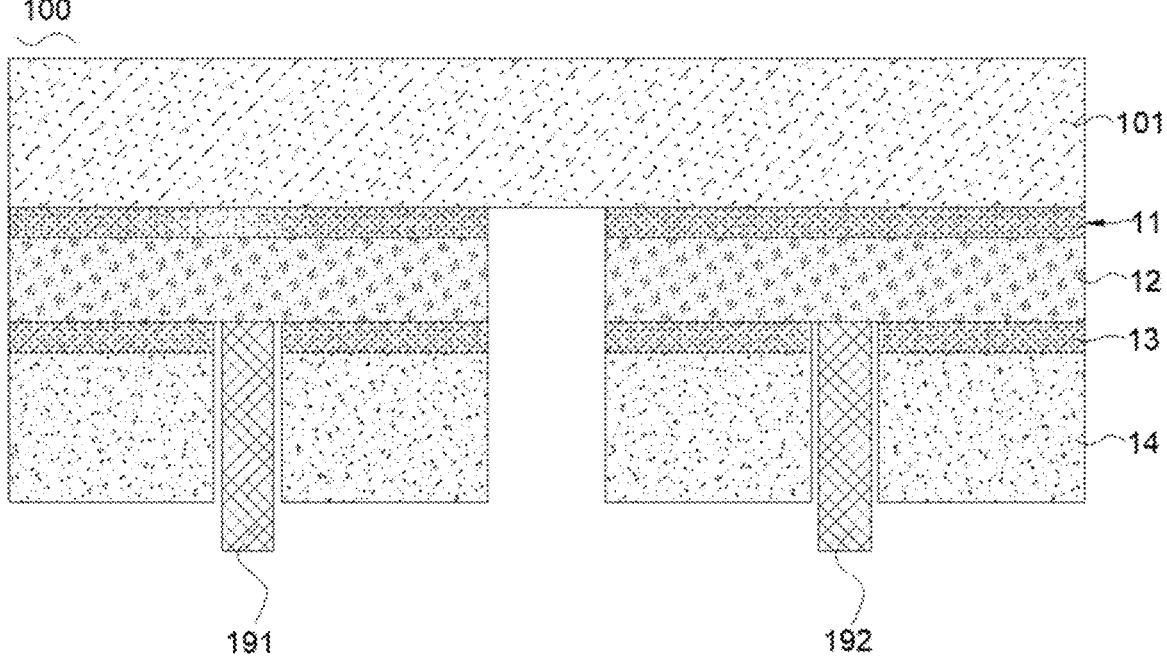
FIG. 3 is a schematic structural diagram of a solar cell provided in an embodiment of the present disclosure.

Referring to FIG. 3, a solar cell 100 in the embodiment of the present disclosure is a topcon (Tunnel Oxide Passivated Contact) cell or a back-contact cell, and the topcon cell or the back-contact cell includes the passivated contact structure 10 of the solar cell 100 according to any of Embodiments 1-8.

In one embodiment, the topcon cell may include a type of high-efficiency crystalline silicon (c-Si) solar cell architecture, for example, to further reduce recombination losses at the cell surface. In one example, a topcon cell may include a crystalline silicon base layer, an ultrathin oxide layer used as a tunnel oxide layer, and a heavily doped polycrystalline silicon layer, sequentially deposited. The topcon cell may further have a front side that uses passivated emitter or PERC for light capture, and a back side for rear contact of solar cell.

Referring back to FIG. 3, according to the solar cell 100 in the embodiment of the present disclosure, the local region of the first silicon oxide layer 11 includes the thinned region 111, the proportion of the silicon oxide content in the first silicon oxide layer 11 is reduced in the thinned region 111, the region other than the thinned region 111 is the non-thinned region 112, the silicon oxide content of the thinned region 111 is lower than the silicon oxide content of the non-thinned region 112, and the thinning of the local region of the first silicon oxide layer 11 allows H to quickly pass through, so that a H passivation effect can be effectively improved, and the heat treatment control difficulty is reduced.

Specifically, in a case where the solar cell 100 is a back-contact cell, conductive regions of P and N polarities are disposed at intervals on one surface of the back-contact cell. In a case where the solar cell 100 is a double-sided contact cell, the conductive regions of the P and N polarities are respectively disposed on two surfaces of the back-contact cell.

Further, the conductive regions of the two polarities can both be the passivated contact structure 10 of the solar cell 100 according to any of Embodiments 1-8, or a P-type conductive region is the passivated contact structure 10 of the solar cell 100 according to any of Embodiments 1-8, and an N-type conductive region is not the passivated contact structure 10 of the solar cell 100 according to any of Embodiments 1-8; or, the N-type conductive region is the passivated contact structure 10 of the solar cell 100 according to any of Embodiments 1-8, and the P-type conductive region is not the passivated contact structure 10 of the solar cell 100 according to any of Embodiments 1-8.

Further, the solar cell 100 includes electrodes with P and N polarities, that is, a first electrode 191 and a second electrode 192 in FIG. 3 are respectively connected to the silicon substrate 101 by the conductive regions of the P and N polarities.

Embodiment 10

A solar cell module in the embodiment of the present disclosure includes the solar cell 100 of Embodiment 9.

According to the solar cell module in the embodiment of the present disclosure, the local region of the first silicon oxide layer 11 includes the thinned region 111, the proportion of the silicon oxide material content in the first silicon oxide layer 11 is reduced in the thinned region 111, the region other than the thinned region 111 is the non-thinned region 112, the silicon oxide content of the thinned region 111 is lower than the silicon oxide content of the non-thinned region 112, and the thinning of the local region of the first silicon oxide layer 11 allows H to quickly pass through, so that a H passivation effect can be effectively improved, and the heat treatment control difficulty is reduced.

In the present embodiment, a plurality of solar cells 100 in the solar cell module can be sequentially connected together in series to form a battery string, so as to realize series-connected busbar output of the current, for example, the series connection of the solar cell can be achieved by providing a solder strip (a bus bar, an interconnection bar), a conductive backsheet, and the like.

It can be understood that in such an embodiment, the solar cell module can further include a metal frame, a backsheet, photovoltaic glass and an adhesive film. The adhesive film can be filled between the front surface and the back surface of the solar cell 100 and the photovoltaic glass, and adjacent solar cells as a filler, the adhesive film can be a transparent colloid with good light transmittance and aging resistance, for example, the adhesive film can be an EVA adhesive film or a POE adhesive film, which can be specifically selected according to actual situations and is not limited herein.

The photovoltaic glass can cover the adhesive film on the front surface of the solar cell 100, the photovoltaic glass can be ultra-white glass, which has high light transmittance and high transparency, and has excellent physical, mechanical and optical properties, for example, the light transmittance of the ultra-white glass can reach more than 92%, and the ultra-white glass can protect the solar cell 100 without affecting the efficiency of the solar cell 100 as much as possible. Meanwhile, the adhesive film can bond the photovoltaic glass and the solar cell 100 together, and the adhesive film can seal and insulate the solar cell 100 and prevent water and moisture.

The backsheet can be attached to the adhesive film on the back surface of the solar cell 100, the backsheet can protect and support the solar cell 100 and has reliable insulativity, water resistance and aging resistance, the backsheet can have multiple choices and can be tempered glass, organic glass, an aluminum alloy TPT composite adhesive film, and the like, which can be specifically set according to specific conditions and is not limited herein. An entirety consisting of the backsheet, the solar cell 100, the adhesive film and the photovoltaic glass can be disposed on the metal frame, the metal frame serves as a main external supporting structure of the entire solar cell module and can provide stable support and installation for the solar cell module, for example, the solar cell module can be installed at a required position via the metal frame.

Embodiment 11

A solar cell system in the embodiment of the present disclosure includes the solar cell module of Embodiment 10.

According to the solar cell system in the embodiment of the present disclosure, the local region of the first silicon oxide layer 11 includes the thinned region 111, the proportion of the silicon oxide material content in the first silicon oxide layer 11 is reduced in the thinned region 111, the region other than the thinned region 111 is the non-thinned region 112, the silicon oxide content of the thinned region 111 is lower than the silicon oxide content of the non-thinned region 112, and the thinning of the local region of the first silicon oxide layer 11 allows H to quickly pass through, so that a H passivation effect can be effectively improved, and the heat treatment control difficulty is reduced.

According to various embodiments, the doped layer and the first silicon oxide layer may contain same type of dopant(s) including, for example, same dopant element(s).

In the present embodiment, the solar cell system can be applied to a photovoltaic power station, for example, a ground power station and a roof power station, a water surface power station, and the like, can also be applied to devices or apparatuses that utilize solar energy for power generation, for example, user solar power supplies, solar street lamps, solar vehicles, solar buildings, and the like. Of course, it can be understood that the application scenarios of the solar cell system are not limited thereto, that is, the solar cell system can be applied to all fields where power generation needs to be performed by using solar energy. Taking a photovoltaic power generation system network as an example, the solar cell system can include a photovoltaic array, a combiner box and an inverter, the photovoltaic array can be an array combination of a plurality of solar cell modules, for example, the plurality of solar cell modules can form a plurality of photovoltaic arrays, the photovoltaic array is connected with the combiner box, the combiner box can converge current generated by the photovoltaic array, and the converged current flows through the inverter to be converted into alternating current required by a mains power grid and then is connected to a mains supply network to realize solar power supply.

The above descriptions are only preferred embodiments of the present disclosure and are not intended to limit the present disclosure, and any modifications, equivalent replacements and improvements and the like, made within the spirit and principles of the present disclosure, should be included in the protection scope of the present disclosure. Moreover, the specific features, structures, materials or features described in the embodiments or examples of the present disclosure can be combined in a proper manner in any one or more embodiments or examples.

What is claimed is:

1. A passivated contact structure of a solar cell, comprising:

a silicon substrate; and a first silicon oxide layer, a doped layer, a second silicon dioxide layer and a passivation layer, which are sequentially disposed on the silicon substrate, wherein a local region of the first silicon oxide layer comprises a thinned region, and a proportion of a silicon oxide content in the first silicon oxide layer is reduced in the thinned region.

2. The passivated contact structure of the solar cell according to claim 1, wherein a doping element of the doped layer and a doping element of the first silicon oxide layer are either a third main group element or a fifth main group element.

3. The passivated contact structure of the solar cell according to claim 2, wherein the third main group element is a boron.

4. The passivated contact structure of the solar cell according to claim 2, wherein the fifth main group element is a phosphorus.

5. The passivated contact structure of the solar cell according to claim 1, wherein a thickness of the first silicon oxide layer and a thickness of the second silicon dioxide layer are both less than or equal to 3 nm.

6. The passivated contact structure of the solar cell according to claim 5, wherein the thickness of the first silicon oxide layer is less than or equal to 2.5 nm, and the thickness of the second silicon dioxide layer is less than or equal to 2 nm.

7. The passivated contact structure of the solar cell according to claim 1, wherein the doped layer is a doped polysilicon layer.

8. The passivated contact structure of the solar cell according to claim 1, wherein the passivation layer is one or a combination of more of an oxide layer, a silicon carbide layer and an amorphous silicon layer.

9. A solar cell, wherein the solar cell is a topcon cell or a back-contact cell, and the topcon cell or the back-contact cell comprises the passivated contact structure of the solar cell according to claim 1.

10. A solar cell module, wherein the solar cell module comprises the solar cell according to claim 9.

11. A solar cell system, wherein the solar cell system comprises the solar cell module according to claim 10.

* * * * *